US010025888B2

(12) United States Patent
Kwon et al.

(10) Patent No.: US 10,025,888 B2
(45) Date of Patent: Jul. 17, 2018

(54) SYSTEM FOR SIMULATING SEMICONDUCTOR DEVICE AND RELATED METHOD OF OPERATION

(71) Applicant: SAMSUNG ELECTRONICS CO., LTD., Suwon-si, Gyeonggi-Do (KR)

(72) Inventors: Ui-Hui Kwon, Hwaseong-si (KR); Vasily Zabelin, Suwon-si (KR); Sachio Nagura, Tokyo (JP); Keun-Ho Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 849 days.

(21) Appl. No.: 14/153,661

(22) Filed: Jan. 13, 2014

(65) Prior Publication Data

US 2014/0257784 A1    Sep. 11, 2014

(30) Foreign Application Priority Data

Mar. 7, 2013    (KR) ........................ 10-2013-0024498

(51) Int. Cl.
*G06F 17/50*    (2006.01)
(52) U.S. Cl.
CPC ................. *G06F 17/5009* (2013.01)
(58) Field of Classification Search
CPC .................................................. G06F 17/5009
USPC ........................................................... 703/13
See application file for complete search history.

(56) References Cited

U.S. PATENT DOCUMENTS

| 5,677,846 | A | * | 10/1997 | Kumashiro | ............. | G06T 17/20 |
| | | | | | | 703/14 |
| 7,082,389 | B2 | | 7/2006 | Nahas | | |
| 7,165,197 | B2 | | 1/2007 | Park et al. | | |
| 7,266,486 | B2 | | 9/2007 | Nahas | | |
| 8,014,192 | B2 | | 9/2011 | Phillips et al. | | |
| 8,161,430 | B2 | | 4/2012 | Jung et al. | | |
| 2011/0178768 | A1 | | 7/2011 | Jung et al. | | |
| 2011/0238196 | A1 | * | 9/2011 | Takahashi | ........... | G06F 17/5018 |
| | | | | | | 700/103 |
| 2012/0179426 | A1 | * | 7/2012 | Fontes | ................ | G06F 17/5018 |
| | | | | | | 703/1 |

FOREIGN PATENT DOCUMENTS

| JP | 2008-158907 | 7/2008 |
| KR | 100981551 | 9/2010 |
| KR | 101083205 | 11/2011 |
| KR | 101094557 | 12/2011 |

* cited by examiner

*Primary Examiner* — Saif A Alhija
(74) *Attorney, Agent, or Firm* — Volentine, Whitt & Francos, PLLC

(57) ABSTRACT

A system for simulating a semiconductor device comprises a data input module configured to receive structural data of the semiconductor device comprising a first region and a second region, and a spatial discretization generating module configured to divide a space of the semiconductor device using the structural data through division of the first region into first type meshes and division of the second region into second type meshes different from the first type meshes.

13 Claims, 12 Drawing Sheets

SYSTEM FOR SIMULATING SEMICONDUCTOR DEVICE AND RELATED METHOD OF OPERATION

CROSS-REFERENCE TO RELATED APPLICATIONS

This application claims priority under 35 U.S.C. § 119 to Korean Patent Application No. 10-2013-0024498 filed on Mar. 7, 2013, the subject matter of which is hereby incorporated by reference.

BACKGROUND OF THE INVENTION

The inventive concept relates generally to systems and methods for simulating a semiconductor device.

In response to continuing demand for high performance memory devices, researchers have devoted considerable resources to the development of magnetic random access memory (MRAM) devices. In doing so, they have attempted to develop MRAM devices with ever decreasing feature size. For instance, researchers are currently intent on developing MRAM devices with a critical dimension less than 20 nm.

To support ongoing research and development, researchers have developed tools for simulating next generation MRAM devices. For instance, certain types of simulators, referred to as micromagnetic simulators, are used to simulate different structures of memory cells for magnetic memory devices.

Unfortunately, the development of micromagnetic simulators has progressed relatively little in recent years. Accordingly, there is a general need for renewed development and improvement of these and other tools in order to enhance the development of next generation MRAM devices.

SUMMARY OF THE INVENTION

In one embodiment of the inventive concept, a system for simulating a semiconductor device comprises a data input module configured to receive structural data of the semiconductor device, comprising a first region and a second region, and a spatial discretization generating module configured to divide a space of the semiconductor device using the structural data through division of the first region into first type meshes and division of the second region into second type meshes different from the first type meshes.

In another embodiment of the inventive concept, a method of simulating a semiconductor device comprises receiving structural data of the semiconductor device comprising a first region and a second region, and generating a first divided region and a second divided region using the structural data through division of the first region into first type meshes and division of the second region into second type meshes that are different from the first type meshes.

In yet another embodiment of the inventive concept, a computing system comprises a central processing unit, and a storage storing a program that simulates a semiconductor device through an operation of the central processing unit, wherein the semiconductor device comprises sequentially stacked first to third regions, the first region and the third region comprising magnetic films, and the second region comprising a non-magnetic film. The program comprises a data input module configured to receive structural data of the first to third regions, and a spatial discretization generating module configured to generate spatial scheme data of the semiconductor device through division of spaces of the first to third regions based on the structural data received by the data input module.

These and other embodiments of the inventive concept may allow for effective calculation of various properties of simulated semiconductor devices, such as quantum-mechanical effects.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, the terms first, second, etc. may be used to describe various features, but these features should not be limited by these terms. Rather, these terms are used merely to distinguish between different features. Thus, for example, a first feature discussed below could be termed a second feature and vice versa without materially altering the presented teachings.

The terms "a" and "an", "the" and similar referents encompass both the singular and the plural forms, unless otherwise indicated. Terms such as "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art. The use of any and all examples or terms herein is intended merely to better illuminate the inventive concept and is not to limit the scope of the inventive concept. Further, unless defined otherwise, all terms defined in generally used dictionaries are not to be interpreted in an overly formal manner.

Figure 1:
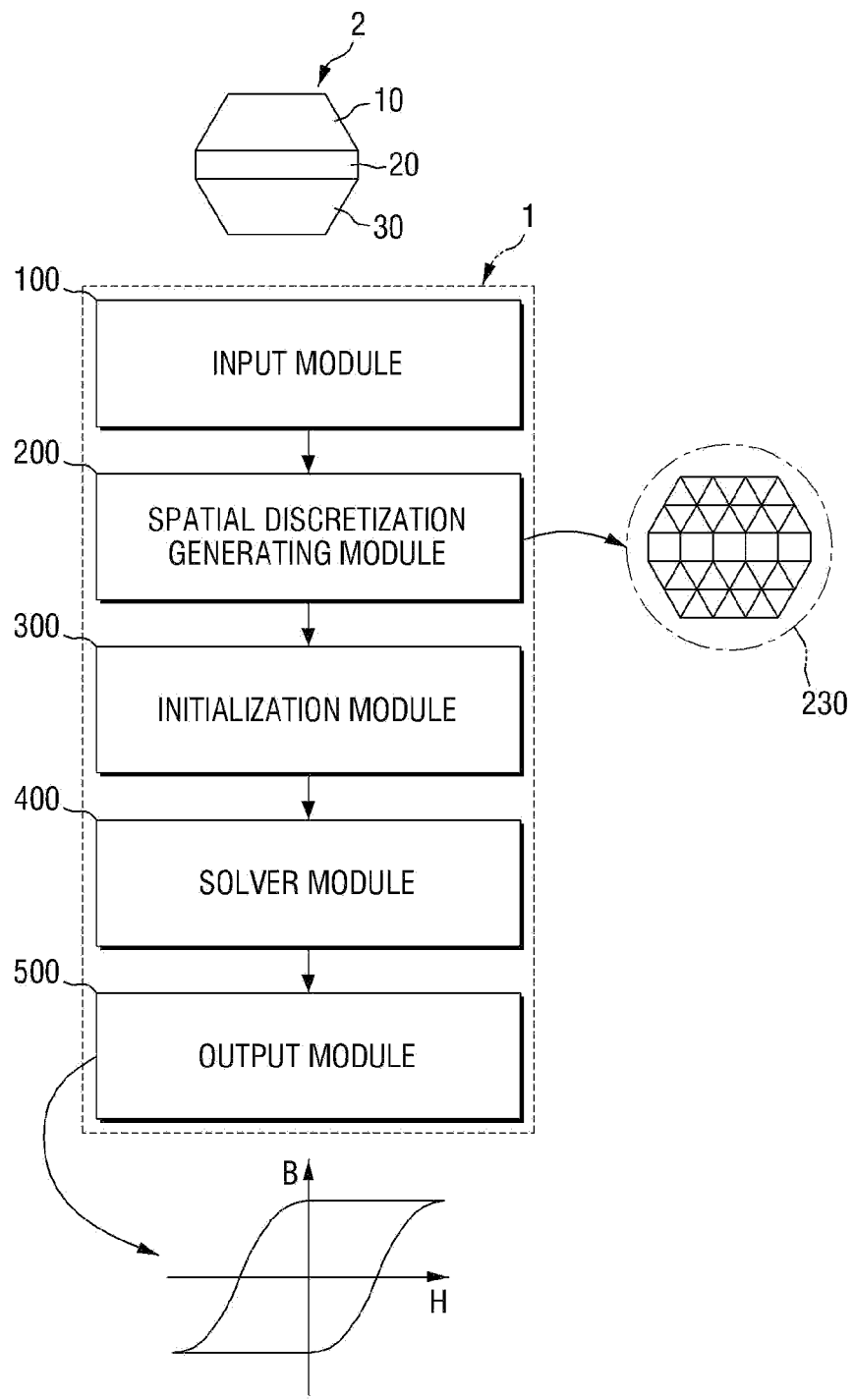
FIG. 1 is a block diagram of a system for simulating a semiconductor device, according to an embodiment of the inventive concept.

FIG. 1 is a block diagram of a system 1 for simulating a semiconductor device according to an embodiment of the inventive concept. To illustrate the operation of system 1, FIG. 1 also shows examples of simulated components. In particular, system 1 will be described as simulating an MRAM, but the inventive concept is not limited thereto.

Referring to FIG. 1, system 1 comprises a data input module 100, a spatial discretization generating module 200, an initialization module 300, a solver module 400, and an output module 500. In some embodiments, system 1 forms a module. In some other embodiments, system 1 is implemented as part of a computing system.

System 1 is used to simulate a semiconductor device 2 comprising a first region 10, a second region 20, and a third region 30. Semiconductor device 2 has a structure in which first to third regions 10, 20 and 30 are sequentially stacked. First region 10 and third region 30 comprise magnetic films, and second region 20 comprises a non-magnetic film.

Although semiconductor device 2 is illustrated with a simple structure in which first to third regions 10, 20, and 30 are sequentially stacked, this is merely for convenience in explanation, and the inventive concept is not limited thereto. The structure of semiconductor device 2 may be, for example, a simplified Magnetic Tunnel Junction (MTJ) portion of the magnetic memory device.

In semiconductor device 2, first region 10 and third region 30 have a tapered form, and second region 20 has a non-tapered form. First region 10 and third region 30 having a tapered form may comprise a magnetic film, and second region 20 having a non-tapered form may comprise a non-magnetic film. First region 10 and the second region 30 each have a trapezoidal shape, and specifically, in an isosceles trapezoidal shape. Second region 20 has a rectangular shape. The MTJ portion of the magnetic memory device has a multilayer structure in which magnetic films and non-magnetic films are stacked (see also, FIG. 12). The magnetic film of the MTJ portion typically comprises a noble metal that is chemically etched in poor fashion. Because the magnetic film comprising the noble metal is etched in poor fashion, a side surface of the magnetic film is inclined after being patterned. This phenomenon is reflected in semiconductor device 2, which is a target of simulation.

Data input module 100 receives an input of structural data of semiconductor device 2. That is, data input module 100 receives an input of the structural data of semiconductor device 2 comprising first region 10 and second region 20. Data input module 100 further receives an input of structural data for third region 30.

The structural data of semiconductor device 2 may indicate, for example, a material that forms the semiconductor device, a thickness of the semiconductor device, a side surface inclination of the semiconductor device, and the like. For example, in first region 10 of semiconductor device 2, data input module 100 may receive an input of the material that forms the semiconductor device 10, the thickness of first region 10, the width of a border between first region 10 and second region 20, and the side surface inclination of first region 10.

FIGS. 2 to 9 are diagrams illustrating certain operations that can be performed by spatial discretization generating module 200 of FIG. 1, according to various embodiments of the inventive concept. As illustrated in FIGS. 2 to 9, spatial discretization generating module 200 divides semiconductor device 2 using the structural data of the semiconductor device input through data input module 100. For example, spatial discretization generating module 200 may generate spatially divided spatial schemes 230, as illustrated in FIG. 1, using the input structural data of semiconductor device 2.

Figure 2:
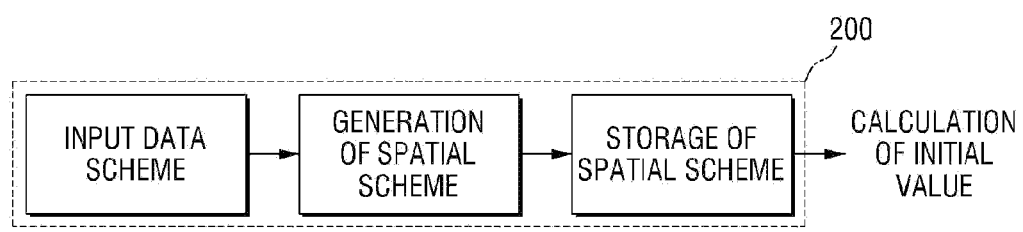
FIG. 2 is a diagram illustrating certain operations that can be performed by a spatial discretization generating module in FIG. 1, according to an embodiment of the inventive concept.
Figure 3:
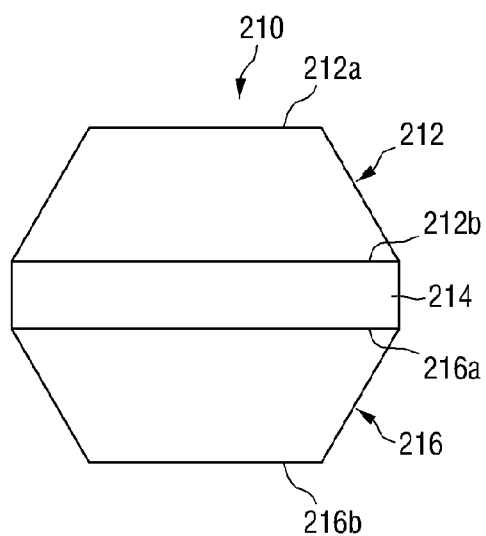
FIG. 3 is a diagram illustrating certain operations that can be performed by the spatial discretization generating module in FIG. 1, according to an embodiment of the inventive concept.

Referring to FIGS. 2 and 3, spatial discretization generating module 200 generates an input data structure 210 using the structural data of the semiconductor device input through data input module 100. Because input data structure 210 is formed using the structural data of the semiconductor device, it may have substantially the same shape as the structure of semiconductor device 2. Here, the term "same shape" refers to the shape of the input data structure where the semiconductor device is enlarged or reduced in a predetermined ratio.

Input data structure 210 comprises first to third undivided regions 212, 214, and 216 that correspond to the first to third regions 10, 20, and 30 of the semiconductor device. First to third undivided regions 212, 214, and 216 have a sequentially stacked structure. First undivided region 212 comprises a first face 212a and a second face 212b, and third undivided region 216 comprises a third face 216a and a fourth face 216b. Second undivided region 214 is interposed between second face 212b of first undivided region 212 and the third face 216a of third undivided region 216.

Input data structure 210 may be generated such that first undivided region 212 and third undivided region 216 are simultaneously generated, and then second undivided region 214 is generated. In other words, after the space of first undivided region 212 and third undivided region 216, which are simultaneously generated, is divided, second undivided region 214 may be generated between the divided first undivided region 212 and second undivided region 216. However, the generation of input data structure 210 is not limited thereto. For example, the first to third undivided regions 212, 214, and 216 may be simultaneously generated.

Figure 4A:
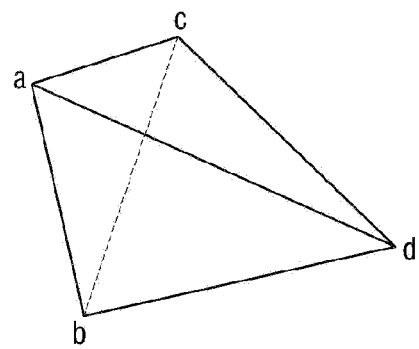
FIGS. 4A, 4B and 4C are diagrams illustrating certain operations that can be performed by the spatial discretization generating module in FIG. 1, according to an embodiment of the inventive concept.

Referring to FIG. 4A, a tetrahedron mesh is one example of an unstructured mesh. The unstructured mesh may be desirable where a simulation target of a frustum of quadrangular pyramid or a complicated 3D structure is spatially discretized. However, when using the unstructured mesh, the analysis of the tetrahedron can be completed by solving equations which are necessary at vertices a, b, c, and d and expanding them to faces and volume.

Figure 4B:
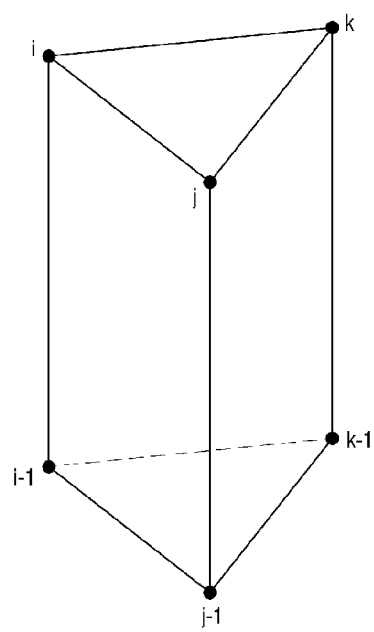
Figure 4C:
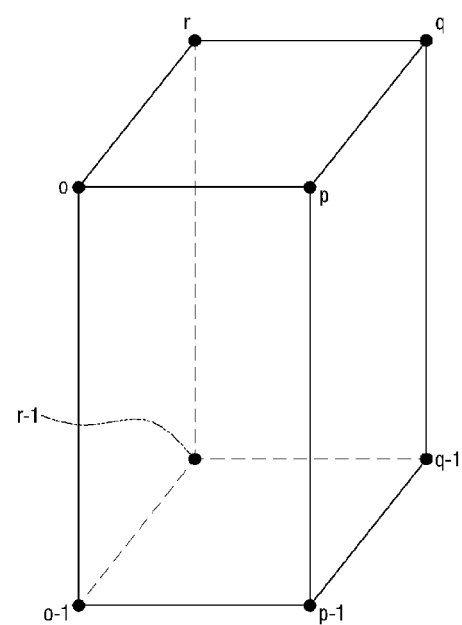

Referring to FIGS. 4B and 4C, a prism mesh is an example of a structured mesh. For example, the structure mesh may be one of a triangular prism (FIG. 4B) and a rectangular prism (FIG. 4C), but is not limited thereto. The structured mesh may change 3D-type simulation to 2D-type simulation. The analysis of the triangular prism can be completed by solving equations which are necessary at vertices i, j, and k, and expanding them to a face composed of i−1, j−1, and k−1. This is because the face composed of i, j, and k is in a parallel relationship with the face composed of i−1, j−1, and k−1.

For spatial discretization of input data structure 210, it is necessary to determine a mesh that becomes a unit and to define a length of one side of the mesh. The length of one side of the mesh may be obtained using a material characteristic value pre-stored in system 1. The pre-stored data may be stored in data input module 100 to be transferred to spatial discretization generating module 200 together with the input structural data, or in spatial discretization generating module 200, or in a separate simulation system other than data input module 100 and spatial discretization generating module 200. Further, the length of one side of the mesh may be optionally adjusted by a user in accordance with the shape of the semiconductor device to be simulated and the result intended to be obtained through the simulation.

Referring to FIGS. 1 to 3 and 5 to 9, spatial discretization module 200 divides semiconductor device 2 into spatial schemes using the structural data input from data input module 100. In other words, spatial discretization module 200 may divide input data structure 210 using the structural data.

Spatial discretization generating module 200 divides first region 10 of semiconductor device 2 into first type meshes, and it divides second region 20 of semiconductor device 2 into second type meshes that are different from the first type meshes. Specifically, spatial discretization generating module 200 generates a first divided region 232 through division of first undivided region 212 of the input data structure into the first type meshes. Spatial discretization generating module 200 generates a second divided region 234 through division of second undivided region 214 of the input data structure into the second type meshes. Further, spatial discretization generating module 200 divides third region 30 of the semiconductor device into the first type meshes and generates a third divided region 236 through division of third undivided region 216 of the input data structure into the first type meshes. Spatial discretization generating module 200 generates a spatial scheme 230 that comprises first to third divided regions 232, 234, and 236 through spatial division of semiconductor device 2.

In system 1, the first type mesh may be an unstructured mesh, and the second type mesh may be a structured mesh. For example, the first type mesh may be a tetrahedron mesh, and the second type mesh may be a prism mesh, specifically, one of a triangular prism mesh and a rectangular prism mesh. Also in system 1, the spatial scheme 230 that is divided by spatial discretization generating module 200 may comprise unstructured meshes and structure meshes.

Although FIG. 1 illustrates that one spatial discretization generating module 200 generates the spatial scheme 230, the inventive concept is not limited thereto. For example, in alternative embodiments, spatial discretization generating module 200 may comprise a first space generating module and a second space generating module. The first space generating module and the second space generating module in spatial discretization generating module 200 may generate spatial scheme 230 through division of the designated regions. That is, the first discretization generating module may generate the first and third divided regions 232 and 236 through division of the first and third regions 10 and 30 of the semiconductor device into the first type meshes. On the other hand, the second discretization generating module may generate the second divided region 234 through division of second region 20 of the semiconductor device into the second type meshes. The first to third divided regions 232, 234, and 236 generated by the first discretization generating module and the second discretization generating module may be combined to complete the spatial scheme 230.

Figure 5:
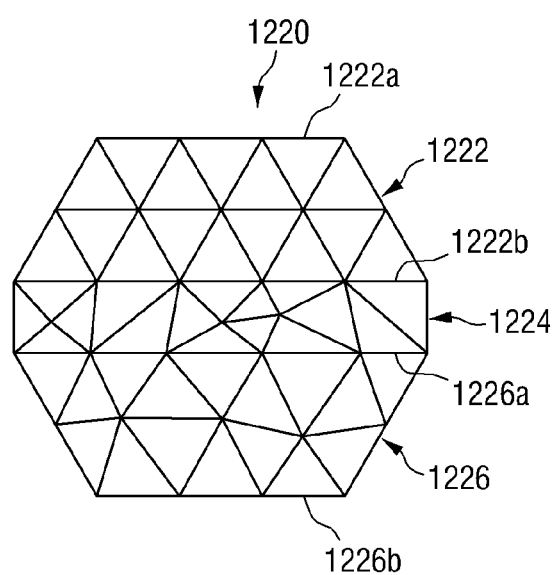
FIG. 5 is a diagram illustrating certain operations that can be performed by the spatial discretization generating module in FIG. 1, according to an embodiment of the inventive concept.
Figure 6:
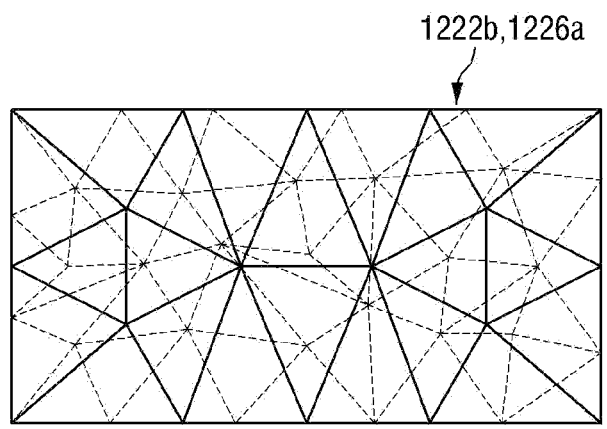
FIG. 6 is a diagram illustrating certain operations that can be performed by the spatial discretization generating module in FIG. 1, according to an embodiment of the inventive concept.

FIGS. 5 and 6 are views illustrating examples where the first to third regions 10, 20, and 30 of semiconductor device 2 are divided into unstructured meshes only. The unstructured mesh used in FIGS. 5 and 6 is a tetrahedron mesh.

Referring to FIGS. 5 and 6, unstructured mesh structure 1220 divided into the unstructured meshes only comprises first to third unstructured mesh regions 1222, 1224, and 1226 sequentially stacked. First unstructured mesh region 1222 comprises a first face 1222a and a second face 1222b that face each other, and third unstructured mesh region 1226 comprises a third face 1226a and a fourth face 1226b that face each other. Second face 1222b of the first unstructured mesh region and third face 1226a of the third unstructured mesh region are also divided into unstructured meshes. Accordingly, on second face 1222b of the first unstructured mesh region and third face 1226a of the third unstructured mesh region, a first surface mesh structure and a second surface mesh structure, which are divided into tetrahedron meshes, are generated.

Referring to FIG. 6, a solid line indicates the first surface mesh structure generated on second face 1222b of the first unstructured mesh region, and a dotted line indicates the second surface mesh structure generated on third face 1226a of the third unstructured mesh region. The first surface mesh structure and the second surface mesh structure have a rectangular shape that is formed through combination of triangles. However, the triangles that form the first surface mesh structure and the second surface mesh structure do not entirely overlap each other.

Figure 7:
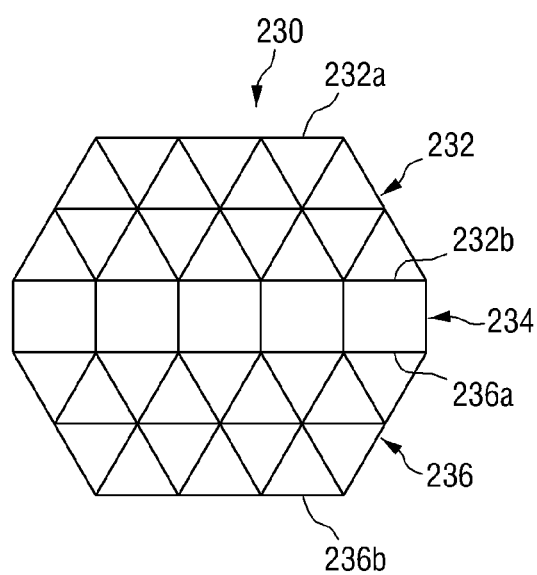
FIG. 7 is a diagram illustrating certain operations that can be performed by the spatial discretization generating module in FIG. 1, according to an embodiment of the inventive concept.
Figure 8:
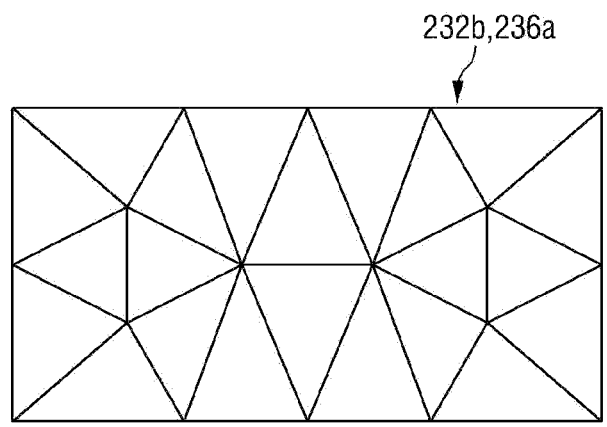
FIG. 8 is a diagram illustrating certain operations that can be performed by the spatial discretization generating module in FIG. 1, according to an embodiment of the inventive concept.

FIGS. 7 and 8 show examples where the first to third regions 10, 20, and 30 of semiconductor device 2 are divided into the first type meshes and the second type meshes that are different from the first type meshes. For example, the first type mesh may be an unstructured mesh, and the second type mesh may be a structured mesh.

Referring to FIGS. 7 and 8, spatial scheme 230 comprises sequentially stacked first to third divided regions 232, 234, and 236. First divided region 232 comprises the first face 232a and the second face 232b that face each other, and the third divided region 236 comprises the third face 236a and the fourth face 236b that face each other. Second face 232b of the first divided region and the third face 236a of the third divided region are also divided into the first type meshes. Accordingly, on second face 232b of the first divided region and third face 236a of the third divided region, a third surface mesh structure and a fourth surface mesh structure, which are divided into the first type meshes, are generated.

In FIG. 8, a solid line indicates the third surface mesh structure generated on second face 232b of the first divided region, and also the fourth surface mesh structure generated on third face 236a of the third divided region. The third surface mesh structure and the fourth surface mesh structure have the same shape, and thus it is illustrated as if only one surface mesh structure existed. That is, the shape of the third surface mesh structure and the shape of the fourth surface mesh structure entirely have the same shape, and thus can entirely overlap each other.

Figure 9:
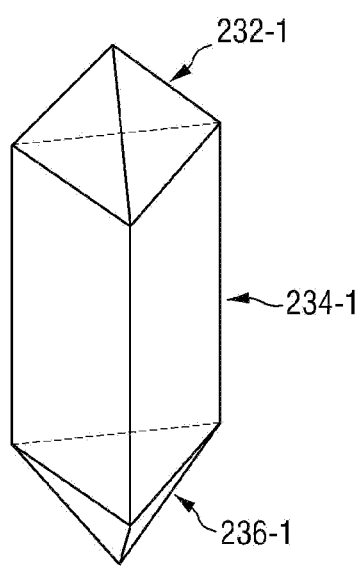
FIG. 9 is a diagram illustrating certain operations that can be performed by the spatial discretization generating module in FIG. 1, according to an embodiment of the inventive concept.

A discussion of why the shape of the third surface mesh structure and the shape of the fourth surface mesh structure may entirely overlap each other will be presented with reference to FIG. 9.

Referring to FIGS. 7 and 9, second divided region 234 is spatially discretized by the structured meshes, and one cell 234-1 in second divided region 234 has a prism shape, for example, a triangular prism shape. On upper and lower portions of one cell 234-1 in the second divided region 234, one cell 232-1 in first divided region 232 and one cell 236-1 in third divided region 236 are generated. Because each cell shares faces with an adjacent cell for simulation, a shape illustrated in FIG. 9 appears. As seen from one of vertices of one cell 232-1 in first divided region 232, which does not meet one cell 234-1 in second divided region 234, a structure of FIG. 9 is shown as a triangle on a plane. Due to such a reason, the shape of the third surface mesh structure and the shape of the fourth surface mesh structure entirely overlap each other.

FIG. 9 illustrates that the shape of one cell 234-1 in second divided region 234 may be a prism, that is, a triangular prism, but is not limited thereto. Alternatively, for instance, the shape of the one cell 234-1 in the second divided region 234 may also be a rectangular prism. If the shape of the one cell 234-1 in the second divided region 234 is the rectangular prism, two cells in first divided region 232 and third divided region 236 may come in contact with the face of the one cell of second divided region 234.

As indicated by the foregoing, system 1 simulates semiconductor device 2 in the form of a magnetic memory device. Spatial discretization generating module 200 divides the magnetic region that corresponds to first region 10 and third region 30 of the semiconductor device into the unstructured meshes, and it generates second spatial scheme 230 through division of the non-magnetic region that corresponds to second region 20 into the structured meshes. The simulation of the magnetic memory device performs quantum-mechanical calculation between magnetic regions, between which a non-magnetic region is interposed. For relatively efficient quantum-mechanical calculation, meshes that face each other, between which the non-magnetic region is interposed, may entirely overlap each other, as described in further detail below.

Referring to FIGS. 1 to 3 and 7, spatial discretization generating module 200 divides the entire space of semiconductor device 2 using the structural data input from data input module 100. Spatial discretization generating module 200 divides the entire space into spatial scheme 230 having discretized spaces.

The discretized spaces divided by spatial discretization generating module 200 comprise unstructured meshes and structured meshes. Specifically, in the discretized space, first and third divided regions 232 and 236 are divided into the unstructured meshes, and second divided region 234 is divided into the structured meshes. Accordingly, the discretized space comprises both the region in which the space is divided into the unstructured meshes and the region in which the space is divided into the structured meshes.

Referring to FIGS. 2 to 7, spatial discretization generating module 200 generates the spatial scheme data to divide the space of the semiconductor device. Where spatial discretization generating module 200 comprises the first spatial generating module and the second spatial generating module, the first spatial generating module and the second spatial generating module may generate first spatial scheme data and second spatial scheme data to divide the space of the semiconductor device. The spatial scheme data may be completed through combination of the data generated by the first spatial generating module and the second spatial generating module.

The spatial scheme data is data of the spatial scheme 230 that is generated by spatially dividing the entire space of the semiconductor device, that is, the input data structure. The spatial scheme data may comprise may parameters, for example, such as an initial time for the spatial scheme 230, the number of nodes, the number of elements, the number of faces, material coefficients, coordinates of vertices, and the like.

Although the above description presents spatial discretization generating module 200 as comprising a portion that can store the spatial scheme data, spatial discretization generating module 200 is not limited thereto. Alternatively, for instance, a space in which the spatial scheme data can be stored may be in a place except for spatial discretization generating module 200.

Figure 10:
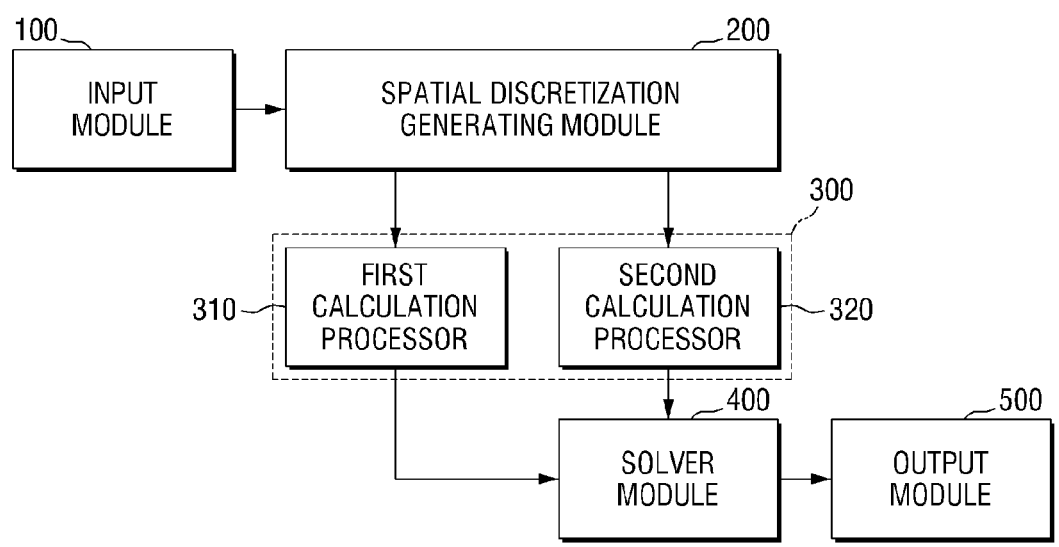
FIG. 10 is a block diagram illustrating a more detailed example of the system of FIG. 1, according to an embodiment of the inventive concept.
Figure 11:
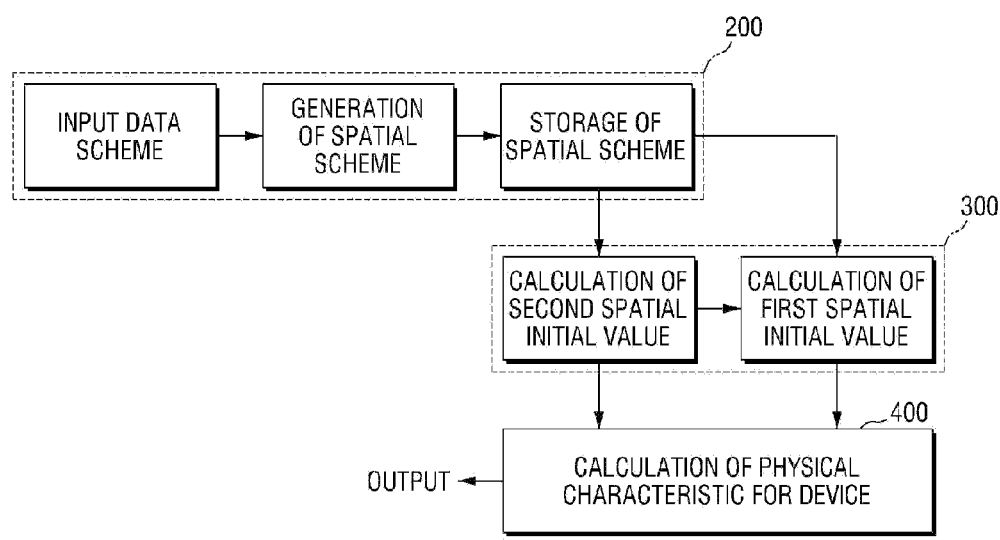
FIG. 11 is a block diagram illustrating functional characteristics of an initialization module illustrated in FIG. 10, according to an embodiment of the inventive concept.

Referring to FIGS. 10 and 11, initialization module 300 receives the spatial scheme data from spatial discretization generating module 200. Initialization module 300 generates the spatial initial value data of the spatial scheme 230 through calculation of the provided spatial scheme data.

Initialization module 300 comprises a first calculation processor 310 and a second calculation processor 320. First calculation processor 310 and second calculation processor 320 receive the spatial scheme data from spatial discretization generating module 200, and they generate spatial initial value data. The division of initialization module 300 into first calculation processor 310 and second calculation processor 320 is for convenience in explanation, and the inventive concept is not limited thereto.

Second calculation processor 320 may comprise, for example, an interlayer exchange coupling (IEC) calculation processor and a spin transfer torque (STT) calculation processor. First calculation processor 310 may comprise an anisotropic energy calculation processor, an exchange field calculation processor, a magnetostatic filed calculation processor, and an oersted field calculation processor.

First calculation processor 310 and second calculation processor 320 in initialization module 300 may perform parallel calculation using the spatial scheme data provided from spatial discretization generating module 200, but are not limited thereto.

Referring to FIGS. 10 and 11, solver module 400 may calculate physical characteristics of the semiconductor device using the spatial initial value data provided from initialization module 300. Specifically, solver module 400 receives the spatial initial value data calculated by first calculation processor 310 and the spatial initial value data calculated by second calculation processor 320 from initialization module 300. Solver module 400 calculates the physical characteristics of the semiconductor device through solving of equations that are necessary for modeling of the semiconductor device. The equations that are necessary for modeling of the semiconductor device may be, for example, Landau-Lifshitz-Gilbert (LLG) equations, and magnetization of the semiconductor device may be calculated using the Landau-Lifshitz-Gilbert equations.

The following explanation assumes that the data input from data input module 100 is an MTJ portion of the magnetic memory device. It also assumes that initialization module 300 calculates an effective magnetic field, and solver module 400 calculates the LLG equations. The LLG equations calculated by solver module 400 are Equation (1) and Equation (2) as below.

$$\frac{dM}{dt} = -\gamma' M \times H_{\text{eff}} + \lambda M \times (M \times H_{\text{eff}}) \quad (1)$$

$$\gamma' = \frac{\gamma}{1 + \gamma^2 \eta^2 M_s^2} \quad (2)$$

and $$\lambda = \frac{\gamma^2 \eta}{1 + \gamma^2 \eta^2 M_s^2}$$

In Equations (1) and (2), Ms denotes saturation magnetization, $\gamma$ denotes an electron gyromagnetic ratio, $\lambda$ denotes a phenomenological damping parameter, and $\gamma'$ denotes a processional term. To calculate the magnetization M of the semiconductor device, it is necessary to obtain the effective magnetic field $H_{\text{eff}}$.

The following Equation (3) can be used to describe the effective magnetic field $H_{\text{eff}}$.

$$H_{\text{eff}} = H_{\text{external}} + H_{\text{aniso}} + H_{\text{exchange}} + H_{\text{static}} + H_{\text{Oersted}} + H_{\text{IEC}} \quad (3)$$

In Equation (3) terms other than $H_{\text{IEC}}$ may be calculated by first calculation processor 310 in initialization module 300. However, the term "$H_{\text{IEC}}$" may be calculated by second calculation processor 320 in initialization module 300. Second calculation processor 320 calculates the term "$H_{\text{IEC}}$" more accurately using the spatial schemes (see FIGS. 7 and 8) comprising different type meshes. The interlayer exchange coupling and the spin transfer torque, which are calculated by the interlayer exchange coupling calculation processor and the spin transfer torque calculation processor in second calculation processor 320, are physical models to calculate quantum interaction between two magnetic regions between which a non-magnetic region is interposed.

To solve the interlayer exchange coupling and the spin transfer torque, in the spatial scheme divided into meshes, it is necessary to know a distance between pair cells, a facing area of pair cells, and a difference in magnetization direction between pair cells. Accordingly, second calculation processor 320, which calculates the interlay exchange coupling and the spin transfer torque, can conveniently calculate them in the case where the spatial scheme is used in which cells that face each other are arranged as shown in FIG. 9. If the spatial scheme is used, it is not required to find pair cells in the facing magnetic regions that are divided into meshes and to separately calculate the facing area or the like. This can be understood by comparison of FIGS. 6 and 8 illustrating the surface structure meshes of the unstructured mesh structure and the surface meshes of the spatial scheme according to an embodiment of the inventive concept, respectively.

Output module 500 receives and outputs the result of calculation provided from solver module 400. That is, output module 500 may output the result of calculation provided from solver module 400 in the form of a graph or data matrix.

Figure 12:
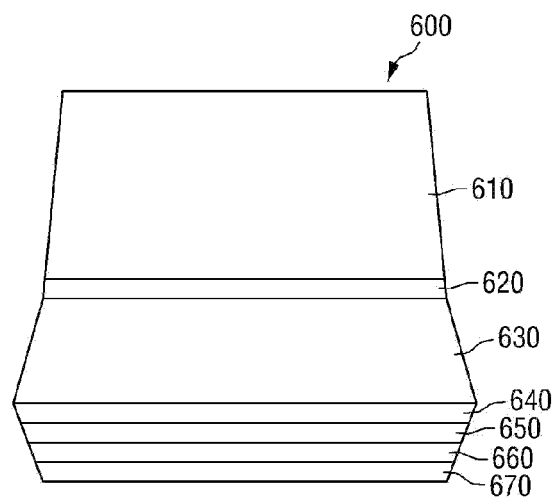
FIG. 12 is a diagram illustrating a simulated semiconductor device, according to an embodiment of the inventive concept.

FIG. 12 is a diagram illustrating a simulated semiconductor device, according to an embodiment of the inventive concept. More specifically, FIG. 12 shows a simulated magnetic tunnel junction portion of a magnetic memory device.

Referring to FIG. 12, a magnetic memory device 600 comprises pinned layers 610, 620, 630, 640, and 650, a tunnel barrier layer 660, and a magnetic free layer 670. The pinned layers comprise first magnetic pinned layer 630, second magnetic pinned layer 610, first and second non-magnetic pinned layers 620 and 640, and pinned boundary layer 650.

First magnetic pinned layer 630 may comprise, for example, a ferromagnetic material, and second magnetic pinned layer 610 may comprise, for example, an antiferromagnetic material. First and second non-magnetic pinned layers 620 may comprise, for example, a non-magnetic material such as metal. Magnetic free layer 670 may comprise, for example, a ferromagnetic material.

The structure of the magnetic tunnel junction portion of the magnetic memory device illustrated in FIG. 12 is merely an example, and the inventive concept is not limited thereto.

Figure 13:
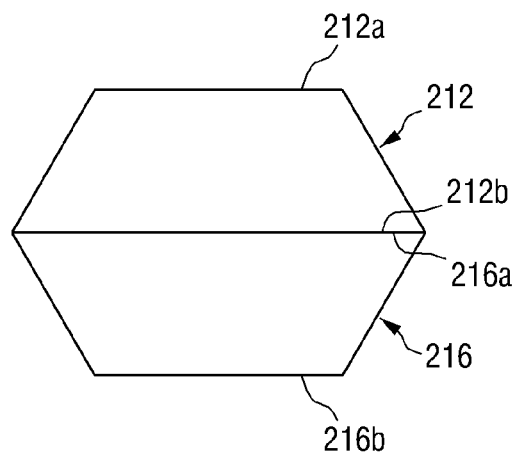
FIG. 13 is a diagram illustrating a method of simulating a semiconductor device, according to an embodiment of the inventive concept.
Figure 14:
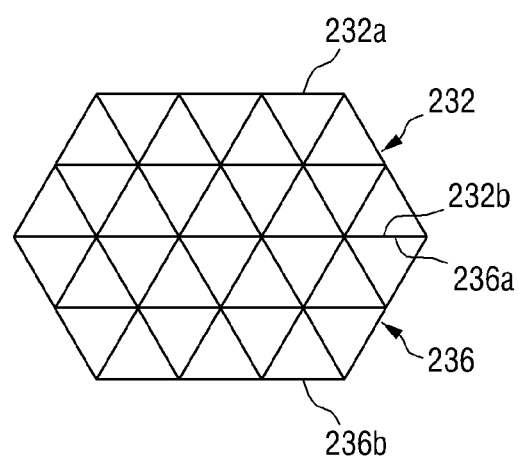
FIG. 14 is another diagram illustrating the method of FIG. 13.
Figure 15:
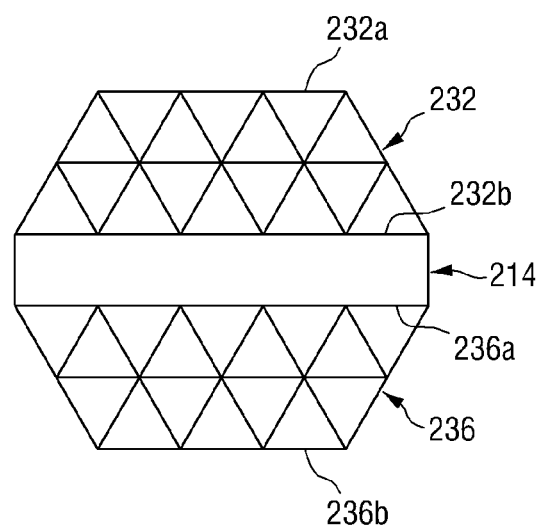
FIG. 15 is another diagram illustrating the method of FIG. 13.

FIGS. 13 to 15 are diagrams illustrating a method of simulating a semiconductor device according to an embodiment of the inventive concept. Specifically, FIGS. 13 to 15 illustrate a method of generating a spatial scheme having discretized spaces comprising different meshes illustrated in FIG. 7. The method of FIGS. 13 through 15 will explained with reference to FIGS. 1, 2, 7, 8, 13, and 15.

Referring to FIG. 1, structural data of semiconductor device 2 comprising first region 10 and second region 20 may be input. Semiconductor device 2 may further comprise third region 30, and may receive an input of the structural data of semiconductor device 2 in which the first to third regions 10, 20, and 30 are sequentially stacked.

Referring to FIG. 13, using the input structural data, first undivided region 212 and third undivided region 216 may be generated. First undivided region 212 comprises first face 212a and second face 212b, and third undivided region 216 comprises a third face 216a and a fourth face 216b. Second face 212b of the first undivided region and third surface 216b of the third undivided region face each other.

Referring to FIG. 14, first undivided region 212 and third undivided region 216 are divided into first type meshes, and fourth divided region 232 and sixth divided region 234 are generated. That is, first region 10 and third region 30 of the semiconductor device may be divided into the first type meshes. As illustrated in FIG. 8, a third surface mesh structure and a fourth surface mesh structure, which are generated on second face 232b of the first divided region and third face 236b of the third divided region, may entirely overlap each other to be shown as one structure.

Referring to FIG. 15, using the input structural data, a second undivided region is generated between first divided region 232 and third divided region 236. Second undivided region 214 is generated between the second face 232b of the first divided region and the third face 2136b of the third divided region. As illustrated in FIG. 7, the second undivided region may be divided into second type meshes that are different from the first type meshes, and second divided region 234 may be generated. That is, second region 20 of the semiconductor device may be divided into the second type meshes. Through this, the semiconductor device is divided, and spatial scheme 230, in which the first type meshes and the second type meshes are mixed, may be generated.

In the above-described method, the first type mesh may be an unstructured mesh, and the second type mesh may be a structured mesh. The unstructured mesh may be, for example, a tetrahedron mesh, and the structured mesh may be a prism mesh, specifically, a triangular prism mesh or a rectangular prism mesh. Moreover, in the above-described method, first region 10 and third region 30 may be magnetic film regions comprising a magnetic material, and second region 20 may be a non-magnetic film region comprising a non-magnetic material.

Referring to FIGS. 1, 2, and 7, first and third divided region data that correspond to first divided region 232 and third divided region 236, which are divided into the first type meshes, and second divided region data that corresponds to the second divided region 234, which is divided into the second type meshes, may be generated. That is, spatial scheme data, in which the first to third divided region data are summed, may be generated.

Referring to FIGS. 1 and 2, using the first to third divided region data, initial value data for semiconductor device 2 may be calculated and generated. That is, using the provided spatial scheme data, the spatial initial value data for the semiconductor device may be generated.

Hereinafter, referring to FIGS. 16 and 17, a computing system adopting the system for simulating the semiconductor device according to an embodiment of the inventive concept and the operation thereof will be described.

Figure 16:
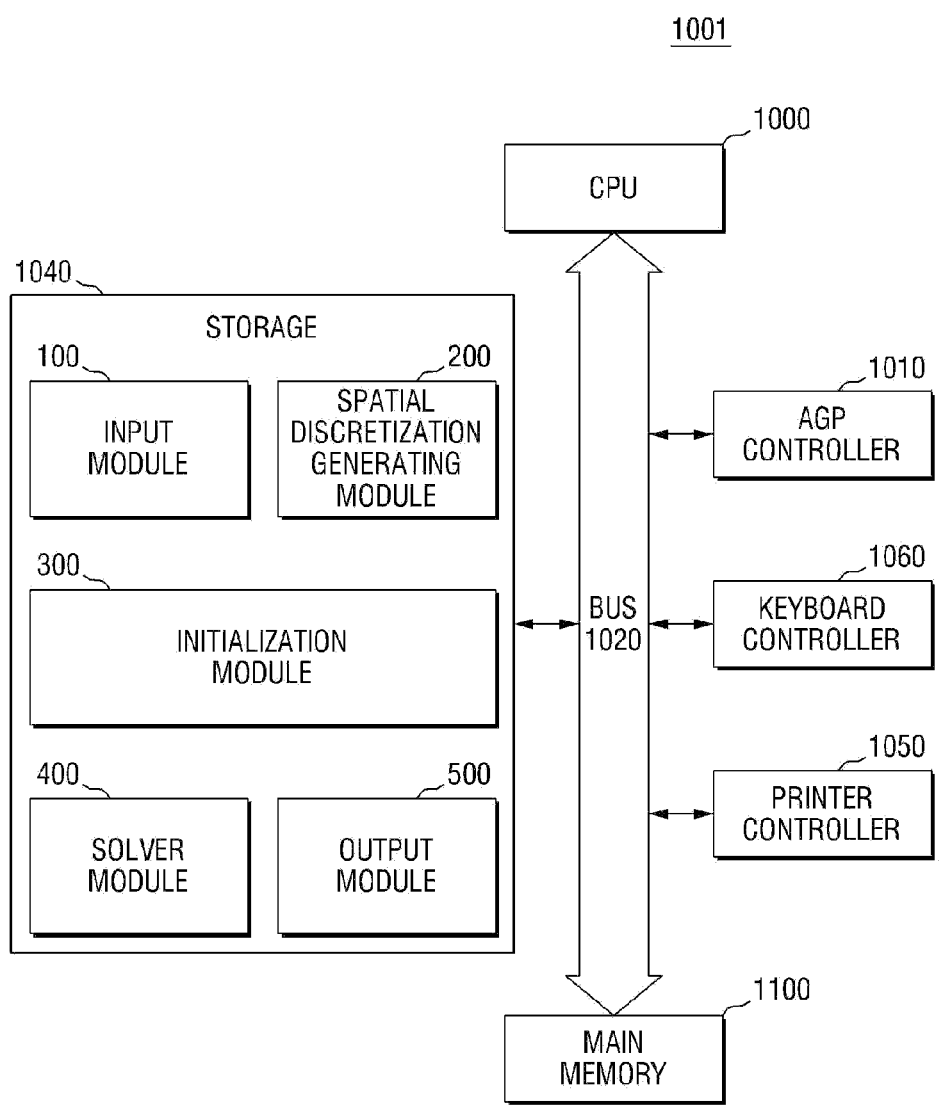
FIG. 16 is a diagram illustrating a computing system incorporating the system of FIG. 1, according to an embodiment of the inventive concept.
Figure 17:
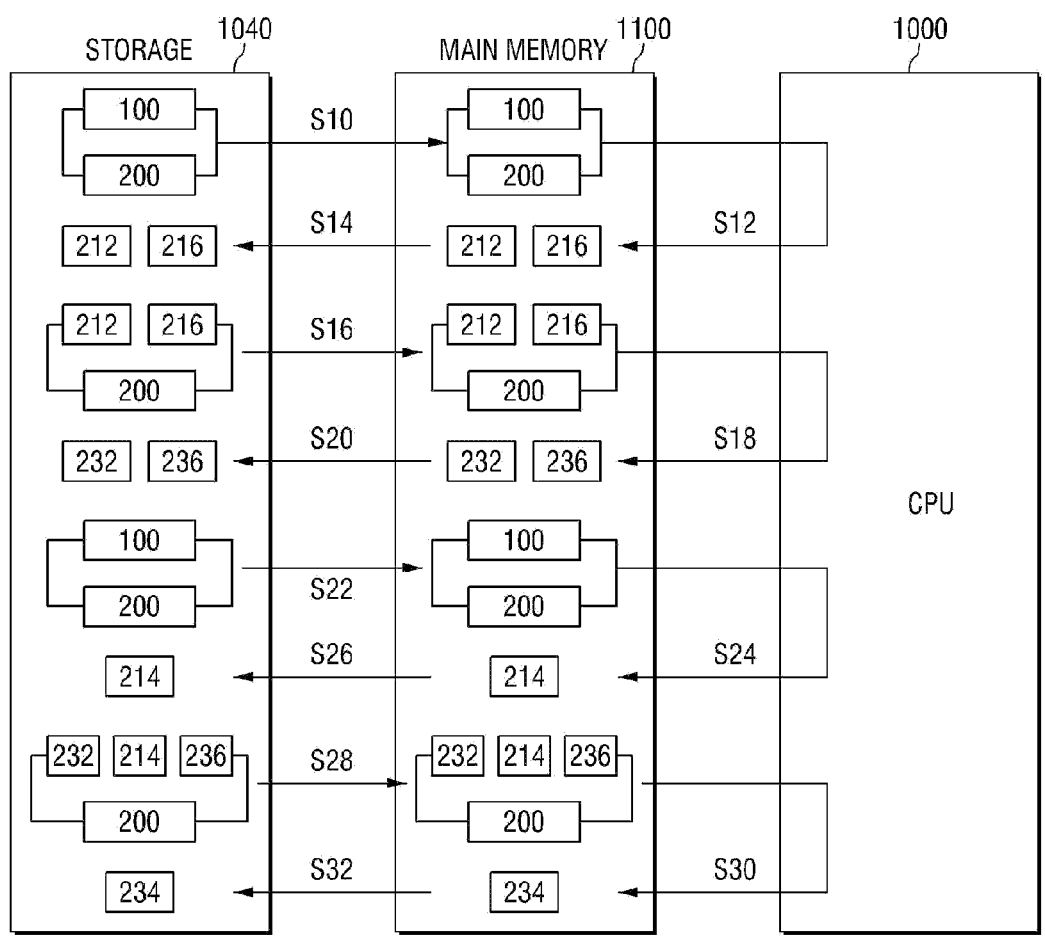
FIG. 17 is a diagram illustrating the operation of the computing system of FIG. 16, according to an embodiment of the inventive concept.

FIG. 16 is a diagram illustrating an example of a computing system incorporating system 1, according to an embodiment of the inventive concept, and FIG. 17 is a diagram explaining the operation of the computing system of FIG. 16.

Referring to FIG. 16, computing system 1001 comprises system 1 within a storage device 1040, such as a solid state disk (SSD) or hard disk drive (HDD), for example. Computing system 1001 further comprises a central processing unit (CPU) 1000, an Accelerated Graphics Port (AGP) device 1010, a main memory 1100, a bus 1020, a keyboard controller 1060, and a printer controller 1050. In various alternative embodiments, additional components may be included or some of the illustrated components may be omitted.

Computing system 1001 may be, for instance, an office computer or a notebook computer that is used in a semiconductor device simulation. However, the inventive concept is not limited thereto.

In computing system 1001, CPU 1000, AGP device 1010, main memory 1100, storage device 1040, the keyboard controller 1060, printer controller 1050, and various peripheral devices may be connected to bus 1020. However, the inventive concept is not limited thereto, and bus 1020 may be modified in the form in CPU 1000.

AGP device 1010 may implement a bus standard that enables 3D graphic expression to be rapidly implemented, and AGP device 1010 may comprise a video card that reproduces a monitor image.

CPU 1000 performs various operations that are required to drive computing system 1001, and execute an OS and application programs.

Main memory 1100 loads data used to perform the operation of CPU 1000 from storage device 1040 and stores the loaded data therein. An example of main memory 1100 may be a Dynamic Random Access Memory (DRAM), but the inventive concept is not limited thereto.

Storage device 1040 is typically a mass data storage device that stores data, and may be implemented by a computer-readable recording medium, such as HDD or SSD. However, the inventive concept is not limited thereto. Further, although it is illustrated that computing system 1001 according to this embodiment has a structure in which storage device 1040 is connected to bus 1020, the inventive concept is not limited thereto, and storage device 1040 may be modified so that it is directly connected to CPU 1000.

Where computing system 1001 incorporates system 1 by software, the software may be stored in, for example, storage device 1040. For instance, in storage device 1040, data input module 100, spatial discretization generating module 200, initialization module 300, solver module 400, and output module 500, which constitute the system for simulating the semiconductor device according to the embodiments of the inventive concept, may be implemented by modules and stored. As the respective modules 100 to 500 stored in storage device 1040, for example, are loaded in main memory 1100 and are processed by CPU 1000, a graph or a data matrix can be output as the final product of the system for simulating the semiconductor device.

Hereinafter, referring to FIG. 17, such an operation will be described in more detail. FIG. 17 illustrates that the space of the semiconductor device is divided based on the input structural data of the semiconductor device. The operation explained with reference to FIG. 17 is an example for explanation, and the operation of computing system 1001 is not limited thereby.

Hereinafter, first to third undivided regions 212, 214, and 216 comprise the spatial scheme data of the first to third undivided regions 212, 214, and 216. Further, first to third divided regions 232, 234, and 236 may comprise the spatial scheme data of the first to third divided regions 232, 234, and 236.

Referring to FIG. 17, data input module 100 and spatial discretization generating module 200 stored in storage device 1040 are loaded to main memory 1100 to be processed by CPU 1000 (S10). Through data input module 100, the structural data of the semiconductor device that is input through the keyboard controller 1060 of FIG. 14 may be input. Then, CPU 1000 generates first undivided region 212 and third undivided region 216 by performing a procedure implemented by spatial discretization generating module 200 with an input of the structural data for the first region comprising the magnetic film and the structural data for the third region comprising the magnetic film, which are in data input module 100 (S12). Then, first undivided region 212 and third undivided region 216, which are generated as above, are transferred from main memory 1100 to storage device 1040 to be stored in storage device 1040 (S14).

Next, the generated first undivided region 212 and third undivided region 216, and spatial discretization generating module 200 are loaded to main memory 1100 to be processed by CPU 1000 (S16). Then, CPU 1000 generates the first divided region 232 and the third divided region 236 by performing a procedure implemented by spatial discretization generating module 200 with an input of the generated first undivided region 212 and third undivided region 216 (S18). Then, first divided region 232 and third divided region 236, which are generated as above, are transferred from main memory 1100 to storage device 1040 to be stored in storage device 1040 (S20).

Next, data input module 100 and spatial discretization generating module 200 are loaded to main memory 1100 to be processed by CPU 1000 (S22). Then, CPU 1000 generates second undivided region 214 by performing a procedure implemented by spatial discretization generating module 200 with an input of the structural data for the second region comprising the non-magnetic film, which is in data input module 100 (S24). Then, second undivided region 214 generated as above is transferred from main memory 1100 to storage device 1040 to be stored in storage device 1040 (S26).

Next, the generated first divided region 232, second undivided region 214, the third divided region 236, and spatial discretization generating module 200 are loaded to main memory 1100 to be processed by CPU 1000 (S28). Then, CPU 1000 generates the second divided region 234 by performing a procedure implemented by spatial discretization generating module 200 with an input of the generated first divided region 232, second undivided region 214, and third divided region 236 (S30). Then, second divided region 234 generated as above is transferred from main memory 1100 to storage device 1040 to be stored in storage device 1040 (S32).

Next, the generated first to third divided regions 232, 234, and 236, and initialization module 300 are loaded to main memory 1100 to be processed by CPU 1000. Then, CPU 1000 generates the spatial initial value data of the semiconductor device by performing a procedure implemented by initialization module 300 with an input of the generated first to third divided regions 232, 234, and 236. Then, the spatial initial value data of the semiconductor device generated as above is transferred from main memory 1100 to storage device 1040 to be stored in storage device 1040.

Thereafter, through the above-described process, CPU 1000 generates simulated physical characteristic values (for example, hysteresis curves) of the semiconductor device by performing a procedure implemented by solver module 400 with an input of the generated spatial initial value data.

A recording medium recorded with a program for implementing the method of simulating the semiconductor device according to an embodiment of the inventive concept will be described.

The recording medium recorded with the program for implementing the method of simulating the semiconductor device according to an embodiment of the inventive concept may be, for example, a computer hard disk, a floppy disk, a 3.5-inch disk, a computer storage tape, a magnetic drum, an SRAM cell, a DRAM cell, an electrically erasable cell (EEPROM cell, EPROM cell, flash cell), a nonvolatile cell, a ferroelectric memory, a ferromagnetic memory, a compact disk (CD), a laser disk, or an optical disk, but is not limited thereto. That is, any storage medium that can be read using a computer may be used as the recording medium.

Although several embodiments of the inventive concept have been described for illustrative purposes, those skilled in the art will appreciate that various modifications, additions and substitutions are possible, without departing from the scope of the inventive concept as defined by the claims.

What is claimed is:

1. A system for simulating a semiconductor device, comprising:
   a data input module configured to receive structural data of the semiconductor device comprising a first region and a second region; and
   a processor that executes instructions to generate a spatially discretized representation of the semiconductor device using the structural data by creating an unstructured mesh through division of the first region into the unstructured mesh and by creating a structured mesh through division of the second region into the structured mesh,
   wherein the semiconductor device is fabricated based on generation of the spatially discretized representation of the semiconductor device.

2. The system of claim 1,
   wherein the unstructured mesh is a tetrahedron mesh, and the structured mesh is a prism mesh.

3. The system of claim 2,
   wherein the structured mesh is one of a triangular prism mesh and a rectangular prism mesh.

4. The system of claim 1,
   wherein the first region comprises a magnetic film, and the second region comprises a non-magnetic film.

5. The system of claim 1,
   wherein the semiconductor device further comprises a third region, and is structured so that the first to third regions are sequentially stacked and the third region is divided into the unstructured mesh created by the processor.

6. The system of claim 5,
   wherein the spatial discretization generating module is further configured to generate first through third divided regions by division of the first to third regions, respectively, wherein a first face of the first divided region and a second face of the third divided region face each other, and a first surface mesh structure and a second surface mesh structure divided according to the unstructured mesh and generated on the second face and a third face, respectively, wherein a shape of the first surface mesh structure and a shape of the second surface mesh structure entirely overlap each other.

7. The system of claim 5,
   wherein the first region and the third region comprise magnetic films, and the second region comprises a non-magnetic film.

8. The system of claim 1,
   wherein the spatial discretization generating module generates spatial scheme data to divide a space of the semiconductor device; and
   wherein the system further comprises an initialization module configured to receive an input of the spatial scheme data from the spatial discretization generating module and generate spatial initial value data through calculation of the spatial scheme data.

9. The system of claim 8,
   wherein the semiconductor device is a magnetic memory device, and the initialization module comprises an interlayer exchange coupling calculating processor and a spin transfer torque calculating processor.

10. The system of claim 8, further comprising:
    a solver module that calculates physical characteristics of the semiconductor device using the spatial initial value data.

11. The system of claim 1, wherein the semiconductor device is a magnetic memory device, the first region is a tapered magnetic region, and the second region is a non-tapered non-magnetic region.

12. A computing system, comprising:
    a central processing unit; and
    a storage that stores a program that simulates a semiconductor device through an operation of the central processing unit, wherein the semiconductor device comprises sequentially stacked first to third regions, the first region and the third region comprise magnetic films, and the second region comprises a non-magnetic film,
    wherein, when executed by the central processing unit, the program causes the computing system to generate a spatially discretized representation of the semiconductor device by performing a process comprising:
      receiving structural data of the first to third regions;
      generating the spatially discretized representation of the semiconductor device using the structural data by creating a first unstructured mesh through division of the first region into the first unstructured mesh, creating a structured mesh through division of the second region into the structured mesh, and creating a second unstructured mesh through division of the third region into the second unstructured mesh, wherein the semiconductor device is fabricated based on generation of the spatially discretized representation of the semiconductor device.

13. A system for simulating a magnetic memory semiconductor device, comprising:

a data input module configured to receive structural data of the semiconductor device comprising a first region and a second region; and a processor that executes instructions to generate a spatially discretized representation of the semiconductor device by performing a process comprising:

generating the spatially discretized representation of the semiconductor device using the structural data by creating an unstructured mesh through division of the first region into the unstructured mesh and by creating a structured mesh through division of the second region into the structured mesh, wherein the first region is a tapered magnetic region, and the second region is a non-tapered non-magnetic region, and wherein the semiconductor device is fabricated based on generation of the spatially discretized representation of the semiconductor device.

* * * * *